(12) United States Patent
Nanda et al.

(10) Patent No.: US 7,605,723 B2
(45) Date of Patent: Oct. 20, 2009

(54) CIRCUITS AND METHODS FOR IMPLEMENTING MODE SELECTION IN MULTIPLE-MODE INTEGRATED CIRCUITS

(75) Inventors: Kartik Nanda, Austin, TX (US); Aryesh Amar, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/011,983

(22) Filed: Dec. 14, 2004

(65) Prior Publication Data

US 2006/0125661 A1 Jun. 15, 2006

(51) Int. Cl.
*H03M 7/00* (2006.01)
(52) U.S. Cl. .......................................... 341/51; 341/50
(58) Field of Classification Search ............. 341/50–90, 341/115–170; 713/501, 600
See application file for complete search history.

(56) References Cited

U.S. PATENT DOCUMENTS

| | | | | |
|---|---|---|---|---|
| 5,030,951 A * | 7/1991 | Eda et al. ..................... | 341/100 |
| 5,668,551 A * | 9/1997 | Garavan et al. ............. | 341/120 |
| 5,774,702 A * | 6/1998 | Mitsuishi et al. ............ | 713/501 |
| 5,777,520 A | 7/1998 | Kawakami et al. | |
| 6,137,355 A * | 10/2000 | Sevic et al. ................... | 330/51 |
| 6,249,686 B1 * | 6/2001 | Dvorkin et al. ........... | 455/552.1 |
| 6,275,952 B1 * | 8/2001 | Kachi .......................... | 713/500 |
| 6,281,821 B1 | 8/2001 | Rhode et al. | |
| 6,396,353 B1 * | 5/2002 | Krobel et al. ................. | 331/16 |
| 6,459,826 B1 * | 10/2002 | Boivin et al. ................. | 385/11 |
| 6,466,833 B1 * | 10/2002 | Lau ............................. | 700/94 |
| 6,492,928 B1 | 12/2002 | Rhode et al. | |
| 6,522,278 B1 | 2/2003 | Rhode et al. | |
| 6,667,704 B1 * | 12/2003 | Grale et al. ................. | 341/123 |
| 6,806,726 B2 * | 10/2004 | Okada et al. ................ | 324/765 |
| 6,907,234 B2 * | 6/2005 | Karr et al. ................ | 455/193.1 |
| 6,963,986 B1 * | 11/2005 | Briggs et al. ................ | 713/320 |
| 7,012,454 B2 * | 3/2006 | Matsui et al. ................ | 327/114 |
| 7,102,390 B2 * | 9/2006 | Frans et al. ................... | 326/82 |
| 7,181,635 B2 * | 2/2007 | Byrne et al. ................. | 713/323 |
| 2002/0109533 A1 | 8/2002 | Gregorian et al. | |
| 2003/0188202 A1 | 10/2003 | D'Angelo et al. | |
| 2005/0039067 A1 * | 2/2005 | Tsau et al. ................... | 713/600 |

OTHER PUBLICATIONS

Yi Suk Yang et al. A Serial Input/Output Circuit with 8 bit and 16 bit Selection Modes, IEEE Journal, vol. 24, No. 6, Dec. 2002 pp. 462-464.*

* cited by examiner

*Primary Examiner*—Lam T Mai
(74) *Attorney, Agent, or Firm*—Thompson & Knight LLP; James J. Murphy

(57) ABSTRACT

Mode selection circuitry selects one of a plurality of operational modes supported by an integrated circuit by detecting a selected connection between a first terminal of the integrated circuit and a mode control terminal of the integrated circuit. Other including a mode control terminal coupled to an integrated circuit for receiving a mode selection signal and mode select circuitry for selecting an operational mode of the integrated circuit in response to a frequency of the mode control signal.

8 Claims, 4 Drawing Sheets

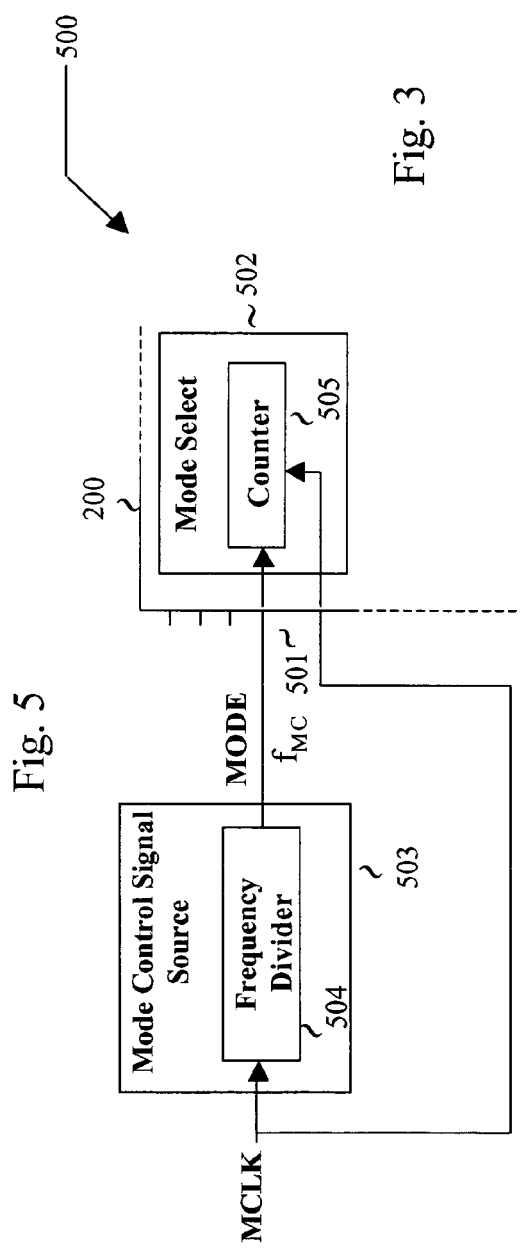
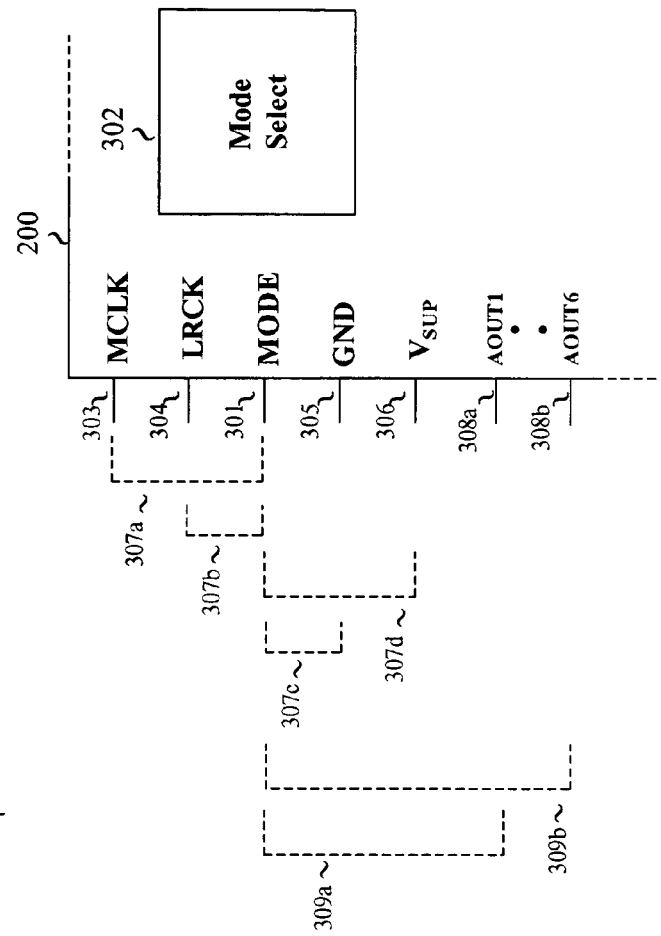
Fig. 5
Fig. 3

CIRCUITS AND METHODS FOR IMPLEMENTING MODE SELECTION IN MULTIPLE-MODE INTEGRATED CIRCUITS

FIELD OF INVENTION

The present invention relates in general to integrated circuits, and in particular to circuits and methods for mode selection in multiple-mode integrated circuits.

BACKGROUND OF INVENTION

As integration levels increase, the ability to fabricate integrated circuits that perform more complex, operations correspondingly improves. However, as the operational capabilities of integrated circuits increase, the problem of optimizing the number of required input/output (I/O) terminals becomes more critical. On the one hand, in order to maximize the number of potential applications for a given integrated circuit, a sufficient number of package pins must be provided to allow all of the available on-chip capabilities to be fully exploited. On the other hand, minimizing the number of pins and associated I/O circuitry is important for optimizing packaging size, reducing the overall chip area and complexity of the integrated circuitry, and decreasing overall device costs.

To maximize flexibility, integrated circuits are often designed to operate in multiple modes, depending on the desired application. For example, a given integrated circuit may include the capabilities of operating on different types or formats of data and/or in response to different clock signal frequencies. In each case, some technique must be provided for selecting between the available operational modes.

Existing multiple-mode integrated circuits often require one or more additional pins dedicated to controlling mode selection, thereby increasing the size, cost and complexity of the integrated circuit and its packaging. Generally, the more modes available for selection, the more control pins that are required. Additionally, many of these existing circuits require substantial external circuitry for generating the required mode control signals.

Hence new techniques for mode control in multiple-mode integrated circuits are required. These techniques should address the competing interests of allowing the full capabilities of an integrated circuit to be exploited, and minimizing the number of pins required for mode selection. Further, such techniques should not significantly increase the necessary external and/or on-chip mode-control circuitry.

SUMMARY OF INVENTION

The principles of the present invention provide for mode control in multiple-mode integrated circuits utilizing a minimum number of pins or terminals. According to one particular embodiment, a mode control terminal is selectively directly connected to another terminal of the integrated circuit to select the operating mode. According to further aspects of these principles, mode selection circuitry is disclosed which includes a mode control terminal coupled to an integrated circuit for receiving a mode selection signal and mode select circuitry for selecting an operational mode of the integrated circuit in response to a frequency of the mode control signal.

Advantageously, the principles of the present invention provide techniques in which only simple digital internal and/or external circuitry and a single dedicated mode selection control pin are required to select between multiple operational modes available in an integrated circuit. Furthermore, these techniques are scalable, allowing a substantial number of modes to be supported, limited only by the number of pins of the corresponding device, that are suitable for such mode control purposes.

BRIEF DESCRIPTION OF DRAWINGS

For a more complete understanding of the present invention, and the advantages thereof, reference is now made to the following descriptions taken in conjunction with the accompanying drawings, in which:

FIG. 3 is a partial block diagram of the DAC shown in FIG. 2 emphasizing one representative mode selection technique according to the principles of the present invention;

FIG. 5 is a partial block diagram of the DAC shown in FIG. 2 emphasizing another representative mode selection technique according to the principles of the present invention.

DETAILED DESCRIPTION OF THE INVENTION

The principles of the present invention and their advantages are best understood by referring to the illustrated embodiment depicted in FIGS. 1-5 of the drawings, in which like numbers designate like parts.

Figure 1:
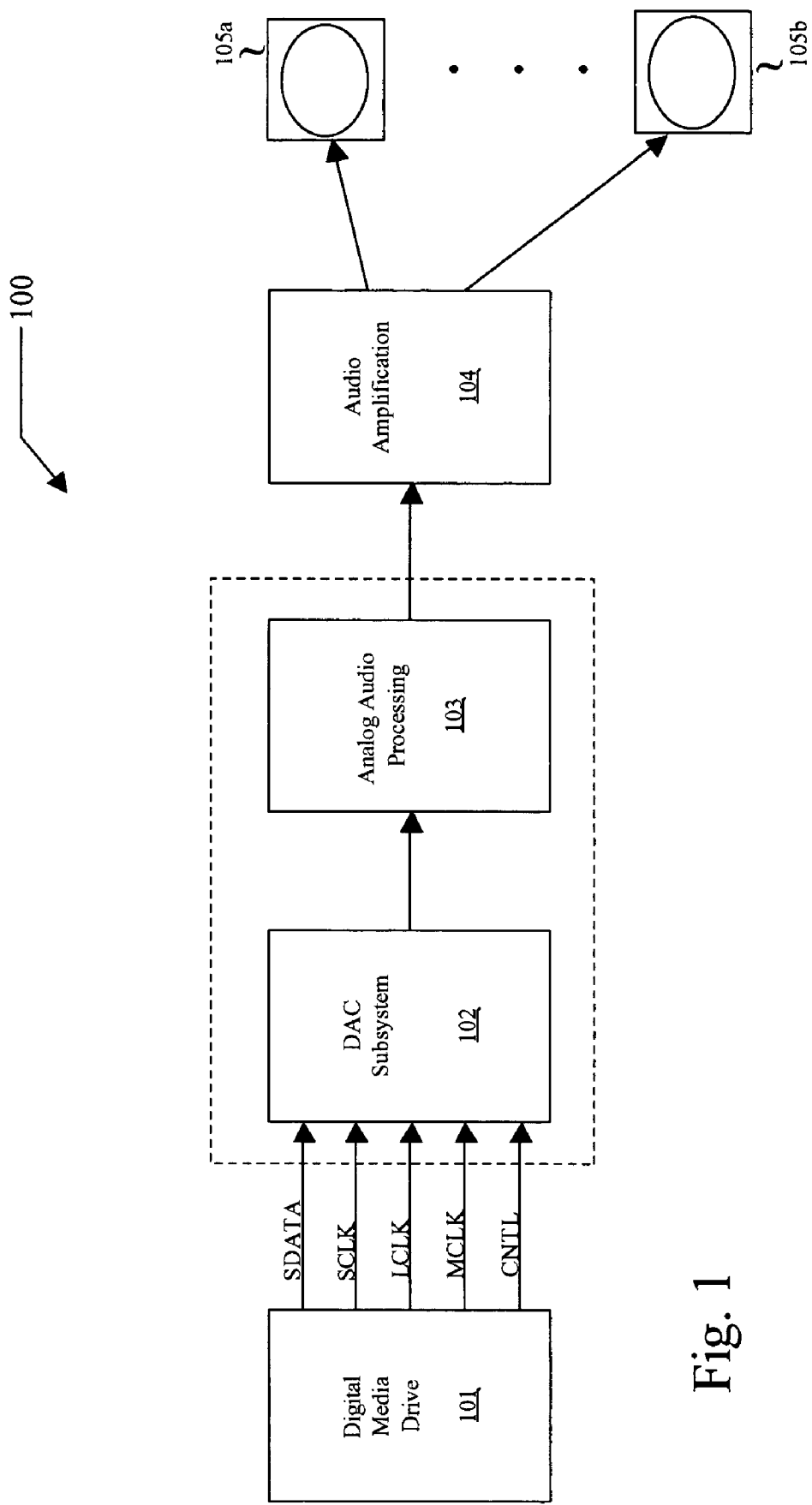
FIG. 1 is a block diagram of an audio system demonstrating one typical application of the principles of the present invention.

FIG. 1 is a high-level block diagram of an audio system 100 suitable for describing a typical system application of the principles of the present invention. Audio system 100 includes a digital media drive 101, such as a compact disk (CD) or digital versatile disk (DVD) player. Digital media drive 101 provides a serial digital audio data stream (SDATA) to a digital to analog converter (DAC) subsystem 102, along with associated clock and control signals. The clock signals include a master clock (MCLK) signal, which is utilized by the digital filters and delta-sigma modulators within DAC subsystem 102. A serial clock (SCLK) signal times the transfer of serial audio data SDATA between digital media drive 101 and DAC subsystem 102. Finally, a left-right clock (LRCK) signal determines whether left or right channel data are currently being transmitted on the SDATA path. Control signals (CNTL) support operations, such as system reset and filter de-emphasis control.

After conversion by DAC subsystem 102, the analog audio signals undergo further processing, such as analog filtering, within analog audio processing block 103. The resulting audio signals are finally amplified by audio amplification block 104. Audio amplification block 104 drives a set of speakers, two of which, 105a and 105b, are shown for illustration.

Figure 2:
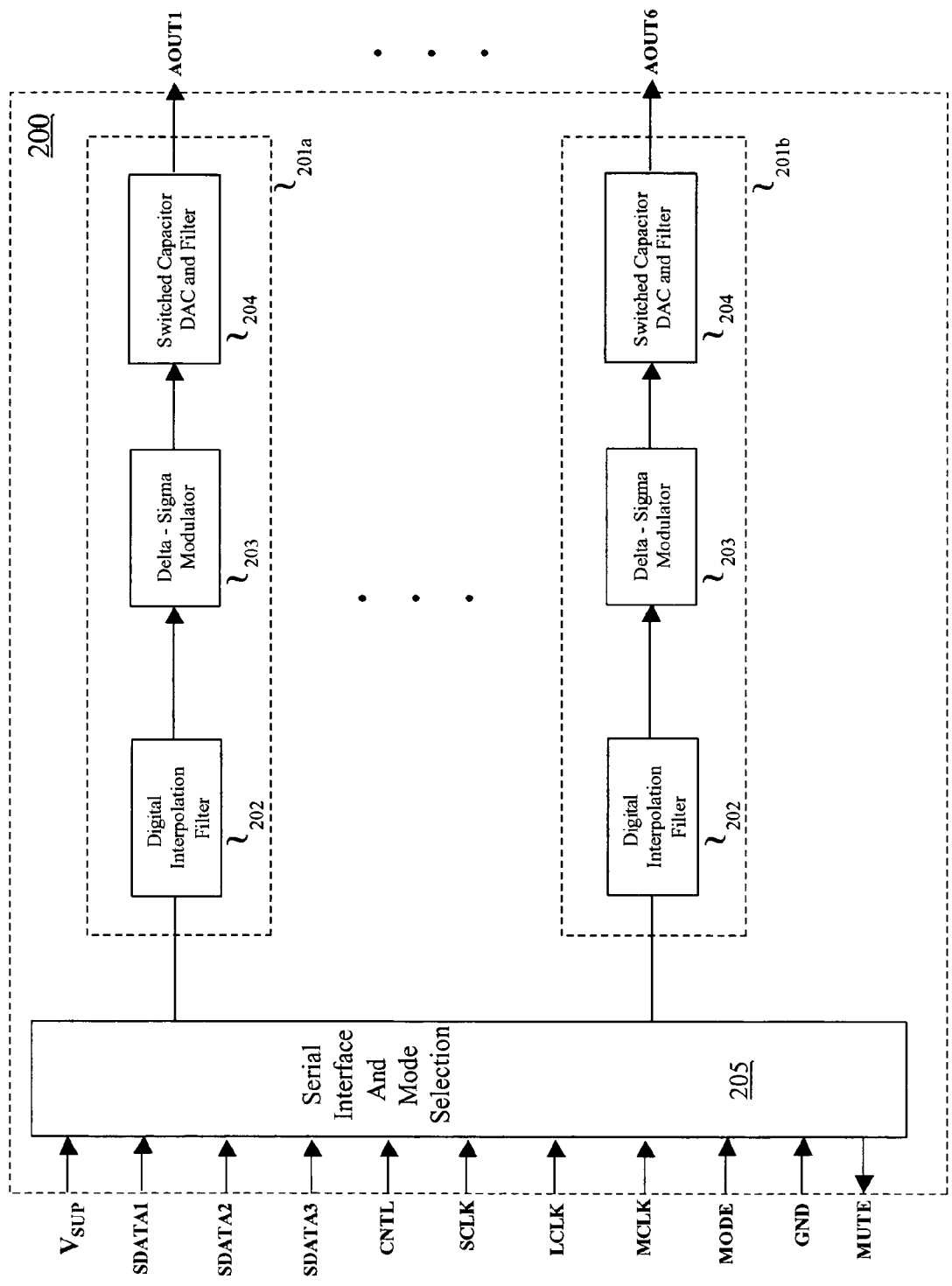
FIG. 2 is a block diagram of a representative multiple-channel digital to analog converter (DAC) embodying the principles of the present invention and suitable for utilization in the DAC subsystem of FIG. 1.

FIG. 2 is a block diagram of a single—chip multiple-channel digital to analog converter (DAC) 200, suitable, in one application, for utilization in DAC subsystem 102 of FIG. 1. In the illustrated embodiment, DAC 200 includes six (6) conversion paths 201 for processing up to six (6) channels of audio data. Two representative conversion paths 201a and 201b are shown in FIG. 2 for illustrative purposes. DAC 200 can receive up to three streams of two-channel digital audio data SDATA1-SDATA3, and output up to six (6) channels of analog audio AOUT1-AOUT6.

Each data path 201a-201b includes a digital interpolation filter 202, a delta-sigma modulator 203, and a switched-capacitor DAC and filter 204. Serial interface and mode selection circuitry 205 includes terminals or pins for receiving the three stereo digital input data streams SDATA1-SDATA3, along with the MCLK, SCLK, and LRCK clock signals described above. DAC 200 also includes one or more power supply pins or terminals $V_{SUP}$ and one or more ground pins or terminals GND. A MUTE terminal is provided for selectively outputting a muting control signal. A Mode control pin or terminal MODE is provided for implementing the mode control circuitry illustrated in FIG. 3, discussed further below.

FIG. 3 is a partial block diagram of system 200 of FIG. 2 emphasizing mode selection circuitry 300 according to an embodiment of the principles of the present invention. Generally, mode selection circuitry 300 utilizes a simple external connection between a single mode pin 301 and a selected one of the existing operational or power/ground pins available on DAC 200 of FIG. 2. In FIG. 3, the selected operational and power and ground pins of DAC 200 utilized for mode control are shown adjacent for illustrative purposes. In actual applications, these pins may be located at varying locations in the pin—out of the embodying device or system.

The embodiment of mode selection circuitry 300 shown in FIG. 3 utilizes a single mode select (MODE) pin 301, the master clock signal pin (MCLK) 303, the left-right clock signal pin (LRCK) 304, and the ground (GND) and power supply (VSUP) pins 305 and 306. By directly connecting MODE pin 301 to a selected one of clock signal pins 303 and 304 or power/ground pins 305 and 306, one of four (4) operational modes of DAC 200 is selected by mode select circuitry 302. Table 1 illustrates the four (4) available operating modes for the illustrated embodiment DAC 200 of FIG. 2.

TABLE 1

| Mode | Pins Connected | Input Data |
|---|---|---|
| 1 | Mode and $V_{SUP}$ | I²S |
| 2 | Mode and GND | Left Justified |
| 3 | Mode and MCLK | 16-bit Right Justified |
| 4 | Mode and LRCK | 24-bit Right Justified |

The modes described in Table 1 are exemplary only; the principles of the present invention are applicable to any other externally controllable (selectable) operations of an integrated circuit. Other typical externally controllable operations include clock selection and generation control, for example, selection of the divisors for internally dividing down the SCLK and MCLK signals, and selection between master and slave modes (e.g. the generation of the SCLK signal internally for transmission to other devices in a system or receipt of the SCLK signal from elsewhere in the system). Additionally, device input and output characteristics, such as sample bit width (e.g. 16 or 24 bits), sample rate, and number of data channels.

In alternate embodiments, different and/or multiple operational and power/ground pins may be utilized as required to select between the supported operational modes. For example, in the embodiment of DAC 200 shown in FIG. 2, other candidate operational pins suitable for mode control include the mute (MUTE), serial clock signal (SCLK), and analog output (AOUT1-AOUT6) pins. In one particular alternate embodiment, DAC 200 outputs a predetermined pattern of logic ones (1's) and zeros (0's) on the analog audio output pins AOUT1-AOUT6 on chip power-up. In particular, the pattern on each analog audio output pin AOUT1-AOUT6 represents a corresponding code. In FIG. 3, two exemplary output pins 308a and 308b are shown corresponding to analog audio outputs AOUT1 and AOUT6, respectively. Two possible connections between output pins 308a and 308b and MODE pin 301 are shown generally at 309a and 309b. Mode select circuitry 302 then determines from the code appearing on MODE pin 301 which analog audio output pin AOUT1-AOUT6 is connected to MODE pin 301. By determining this interconnection, mode select circuitry 302 determines the operating mode for DAC 200. Once the proper mode has been selected, DAC 200 enters normal operation, at which time which analog audio output pins AOUT1-AOUT6 operate as a normal output port for outputting the corresponding analog audio output signals.

Figures 4A, 4B:
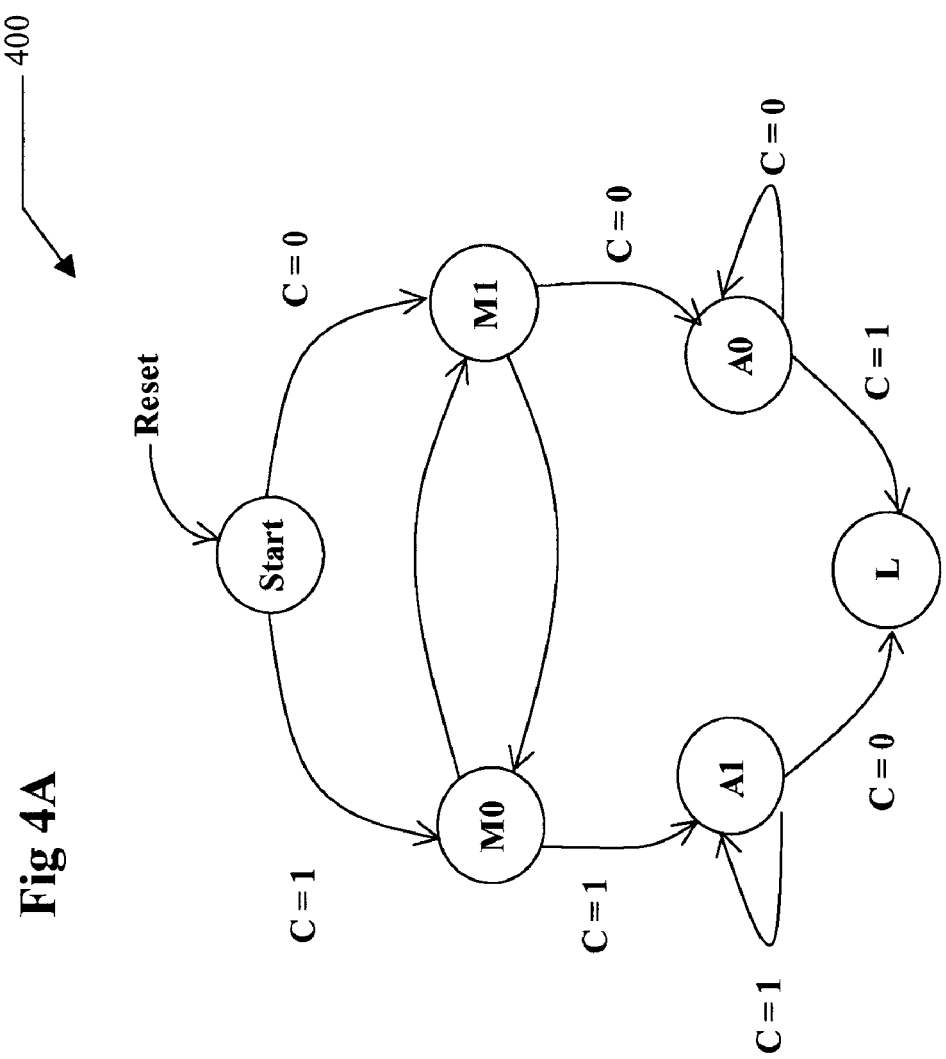
FIG. 4A is a state machine illustrating the operation of the mode selection circuitry of FIG. 4.
FIG. 4B is a block diagram of a representative circuit suitable for generating the controls signals shown in FIG. 4.

FIG. 4A is a state diagram illustrating the operation of a state machine 300 within mode select circuitry 302 in the illustrated embodiment of DAC 200 of FIG. 2. FIG. 4B illustrates the generation of the control signal c from a D-type flip-flop 301, which is clocked by the signal appearing at MODE pin 301.

Generally, in state machine of 400, when MODE pin 301 is connected to MCLK pin 303, mode select circuitry 302 oscillates between the states M0 and M1. In the illustrated embodiment, state machine 400 is timed by the MCLK signal. In particular, when MODE pin 301 is connected to LRCK pin 301, then mode select circuitry 302 halts in the L state of FIG. 4A. Similarly, when MODE pin 301 is connected to either $V_{SUP}$ pin 306 or GND pin 305, the state machine of FIG. 4A halts at either state A0 or state A1. In this case, mode select circuitry 302 determines whether the voltage at MODE pin 301 has either a logic high (1) state or a logic low (0) state to determine if MODE pin 301 is connected to either $V_{SUP}$ pin 306 or GND pin 305, and thereby determine the selected mode.

In the illustrated embodiment, when MODE pin 301 is connected to MCLK pin 303, flip-flop 401 of FIG. 4B toggles such that the c signal toggles at the frequency of the MCLK signal between logic high and logic low values (i.e. 010101 . . . ). On the other hand, if MODE pin 301 is connected to LRCK pin 304, the c signal output from flip-flop 401 is composed of strings of n-number of logic high and low values (00 . . . n, 11 . . . n, 00 . . . ), in which n is the ratio of the frequency of the MCLK signal to the frequency of the LRCK signal, and is greater than two (2). Finally, if MODE pin 301 is connected to either $V_{SUP}$ pin 306 or GND pin 305, flip-flop 401 does not toggle. Specifically, the c signal remains with either a static logic high value (c=1), for a connection to $V_{SUP}$ pin 306, or a logic low (c=0) value, for a connection to GND pin 305.

With every rising edge of the MCLK signal, state machine 400 of FIG. 4A determines the current value of the c signal and transitions to the next state accordingly. In particular, when MODE pin 301 is connected to MCLK pin 303, and state machine 400 is in the START state of FIG. 4A after reset, the value c=0 causes state machine 400 to transition to the M1 state at the rising edge of the MCLK signal. Similarly, when state machine 400 is in the START state, the value c=1 causes state machine 400 to transition to the M0 state with the rising edge of the MCLK signal.

When MODE pin 301 is connected to MCLK pin 303, the c signal will never include two consecutive logic high (c=1) or logic low (c-0) values for two consecutive rising edges of the MCLK signal. Therefore, on the next rising edge of the MCLK signal, if state machine 400 is at state M1, the next value of the c signal is c=0, and state machine 400 transitions to state M0. Similarly, if state machine 400 is at state M0, the next value of the c signal is c=1, and state machine 400 transitions to state M0. Since the c signal continues to toggle between the states c=0 and c=1, state machine 400 continues to transition between the M0 and M1 states, and a determination is made that MODE pin 301 is connected to MCLK pin 303.

On the other hand, when MODE pin 301 is connected to LRCK pin 304, the c signal will include strings of at least two consecutive logic high (1) or logic low (0) values. For example of a ratio n=2, if c=11 at the START state of FIG. 4A, state machine 400 transitions to state M0 and then to state A1 on the next two rising edges of the MCLK signal. When the c signal thereafter transitions to c=00, state machine 400 transitions to state L. Similarly, if c=00 at the START state of FIG. 4bA, state machine 400 transitions to state M1 and then to state A0 on the next two rising edges of the MCLK signal. When the c signal transitions to c=11, state machine 400 transitions to state L. In both cases, state machine thereafter remains at state L, and a determination is made that MODE pin 301 is connected to LRCK pin 304.

If MODE pin 301 is connected to either $V_{SUP}$ pin 306 or GND pin 305, the c signal remains with either a static logic high value (c=1) or logic low (c=0) value, as discussed above. State machine 400 therefore remains in either the A0 state or the A1 state. The A0 state is then interpreted as a connection between MODE pin 301 and GND pin 305, and the A1 state is interpreted as a connection between MODE pin 301 and $V_{SUP}$ pin 306.

Furthermore, the principles of the present invention are not limited to a single mode control pin MODE 301; multiple mode control pins may be provided in alternate embodiments for supporting additional operational modes. Finally, the operating modes shown in Table 1 are exemplary only, and may also vary in alternate embodiments of the inventive principles.

In addition to detecting static voltage levels, such as $V_{SUP}$ and GND, mode select circuitry 302 of the embodiment of FIG. 3 may also detect the presence of either of the MCLK or LRCK clock signals at MODE pin 301 by simply determining if the frequency at mode control pin 301 is equal to or less than the frequency of the MCLK signal. Alternatively, the counting technique utilized in mode select circuitry 302 of FIG. 3, discussed above, may be utilized.

FIG. 5 is a partial block diagram of system 200 of FIG. 2 emphasizing mode selection circuitry 500 within serial interface and mode selection block 205 according to another embodiment of the inventive principles. Mode selection circuitry 500 includes a single mode control terminal 501, which receives a mode control signal MODE, which could be a signal having a frequency $f_{MC}$ provided by a simple external mode control signal source 503. Based on the frequency $f_{MC}$ of the MODE signal, on-chip mode control circuitry 502 selects the corresponding operational mode for DAC 200.

In the illustrated embodiment, external mode control signal source 503 includes a frequency divider 504 that generates the mode control signal MODE of frequency $f_{MC}$ by dividing the MCLK signal by a multiple of two (2), with the multiple chosen to result in the specific frequency $f_{MC}$ representing the desired mode. For example, if the MCLK signal has a frequency of 12 MHz, and four operating modes are available in a given embodiment of DAC 200, these four modes can be represented as 12 MHz, 6 MHz, 3 MHz, and 1.5 MHz. In this case, mode control signal source 503 is implemented digitally with a simple set of flip-flops or a counter.

Alternatively, any other clock or other periodic signal provided to DAC 200 of FIG. 2, such as the LRCK signal, may be divided to generate the mode control signal MODE with frequency $f_{MC}$. Additionally, while in the illustrated embodiment of DAC 200 mode control signal source 503 generates the frequency $f_{MC}$ by dividing the MCLK signal by multiples of two (2), other divisors may be used in alternate embodiments.

Detection of the frequency $f_{MC}$ within mode select circuitry 502 may be performed utilizing any one of a number of techniques. In the illustrated embodiment, mode select circuitry 502 includes a counter 505, which counts the number of periods of the MODE signal corresponding to a selected number of periods of the MCLK signal. For example, in one embodiment, counts 505 counts the number of periods of the MODE signal, within a selected error range, corresponding to 1024 periods of the MCLK signal. In this example, a count of 1024 periods of the MODE signal is decoded as Mode 1, a count of 512 periods is decoded as Mode 2, a count of 256 is decoded as Mode 3, and so on.

In sum, the principles of the present invention provide techniques in which only simple digital circuitry and a minimal number of dedicated mode selection control pins are required to select between multiple operational modes. Furthermore, these techniques are scalable, allowing a substantial number of available modes to be supported, limited only by the number of pins of the corresponding device that are suitable for such mode control purposes.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A method for mode control in an integrated circuit supporting multiple operating modes comprising:
    detecting a selected connection between an output pin of an integrated circuit and a mode control pin of the integrated circuit, including decoding a code output from the output pin during power-up of the integrated circuit to identify the output pin from a plurality of output pins provided on the integrated circuit; and
    selecting one of a plurality of operational modes corresponding to the connection between the output pin and the mode control pin.

2. Mode selection circuitry for selecting one of a plurality of operational modes supported by an integrated circuit comprising mode select circuitry for detecting a selected connection between an output pin of the integrated circuit and a mode control pin of the integrated circuit, the mode select circuitry operable to select in response to detecting the selected connection one of the plurality of operational modes corresponding to the selected connection, wherein the output pin is a selected one of a plurality of output pins and outputs a code during power-up of the integrated circuit for identifying the selected output pin connected to the mode control pin.

3. An integrated circuit supporting multiple operating modes comprising:
    circuitry for detecting a selected connection between an output pin of an integrated circuit and a mode control pin of the integrated circuit, the circuitry for detecting operable to decode a code output from the output pin during power-up of the integrated circuit to identify the output pin from a plurality of output pins provided on the integrated circuit; and circuitry for selecting one of a plurality of operational modes corresponding to the connection between the output pin and the mode control pin.

4. The integrated circuit of claim 3, wherein the integrated circuit comprises a digital to analog converter.

5. The integrated circuit of claim 4, wherein the digital to analog converter comprises a multiple-channel digital to analog converter.

6. The integrated circuit of claim 3, wherein the integrated circuit comprises an audio processing integrated circuit.

7. The integrated circuit of claim 6, wherein the audio processing integrated circuit comprises an audio digital to analog converter.

8. The integrated circuit of claim 3, wherein the plurality of operating modes comprises a plurality of operating modes for processing input data of differing input formats.

* * * * *